(12) United States Patent
Khellah et al.

(10) Patent No.: US 6,985,380 B2
(45) Date of Patent: Jan. 10, 2006

(54) SRAM WITH FORWARD BODY BIASING TO IMPROVE READ CELL STABILITY

(75) Inventors: Muhammad M. Khellah, Lake Oswego, OR (US); Dinesh Somasekhar, HIllsboro, OR (US); Yibin Ye, Hillsboro, OR (US); Ali R. Farhang, Beaverton, OR (US); Gunjan H. Pandya, Beaverton, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 10/810,093

(22) Filed: Mar. 26, 2004

(65) Prior Publication Data

US 2005/0213370 A1    Sep. 29, 2005

(51) Int. Cl.
*G11C 11/412*    (2006.01)

(52) U.S. Cl. .................. 365/156; 365/154; 365/226; 365/189.09

(58) Field of Classification Search .............. 365/156, 365/154, 189.09, 226

See application file for complete search history.

(56) References Cited

U.S. PATENT DOCUMENTS 5,394,026 A * 2/1995 Yu et al. .................. 327/536
5,668,770 A * 9/1997 Itoh et al. .................. 365/227
6,232,827 B1 * 5/2001 De et al. .................. 327/537
6,593,799 B2 * 7/2003 De et al. .................. 327/534

OTHER PUBLICATIONS

Wann, C. et al., "CMOS with Active Well Bias for Low-Power and RF/Analog Applications", IEEE Symposium on VLSI Technology Digest of Technical Papers, 2000, pp. 158-159.

Bhavnagarwala, A. J. et al., "The Impact of Intrinsic Device Fluctuations on CMOS SRAM Cell Stability", IEEE Journal of Solid-State Circuits, Apr. 2001, pp. 658-665, vol. 36, No. 4.

Bhavnagarwala, A. J. et al., "Dynamic-Threshold CMOS SRAM Cells for Fast, Portable Applications", IEEE, 2000, pp. 359-363.

* cited by examiner

*Primary Examiner*—Andrew Q. Tran
(74) *Attorney, Agent, or Firm*—Blakely, Sokoloff, Taylor and Zafman

(57) ABSTRACT

A SRAM memory cell comprising cross-coupled inverters, each cross-coupled inverter comprising a pull-up transistor, where the pull-up transistors are forward body biased during read operations. Forward body biasing improves the read stability of the memory cell. Other embodiments are described and claimed.

12 Claims, 6 Drawing Sheets

SRAM WITH FORWARD BODY BIASING TO IMPROVE READ CELL STABILITY

FIELD

The present invention relates to digital circuits, and more particularly, to Static Random Access Memory (SRAM) circuits.

BACKGROUND

With the scaling of transistor dimensions to smaller sizes, the variability in the number and location of dopant atoms in transistor channels may result in unwanted variations in device threshold voltage among various transistors. This may be of particular concern when using minimum geometry devices in area-limited circuits, such as Static Random Access Memory (SRAM). Mismatch in threshold voltage among neighboring devices within a SRAM cell may dramatically reduce its read stability. Read cell stability may be loosely defined as the probability that during a read operation performed upon a cell, the cell will "flip" its content. This may be explained by considering FIGS. 1a and 1b.

A portion of a typical SRAM is shown in simplified form in FIG. 1a, and one of its 6T SRAM cells is shown in FIG. 1b. In FIG. 1a, during a pre-charge phase, pre-charge line 102 is brought LOW so that pull-up pFETs 104 and 106 charge bitlines 108 and 110 to Vcc (HIGH). During a read operation, pre-charge line 102 is HIGH so that pull-ups 104 and 106 are OFF; and one of the wordlines, say wordline WL1, is brought HIGH so that its corresponding cell, Cell1, is read. Referring to FIG. 1b, assume that node 114 is LOW to store a logical "0" and node 116 is HIGH to store a logical "1", and that bitlines 108 and 110 have been pre-charged to Vcc. At the beginning of a read operation, wordline 112 is brought HIGH, resulting in node 114 rising above LOW ("0") due to the voltage divider comprising access nFET 118 and pull-down nFET 120. This voltage division is between the Vcc pre-charged bitline 110 and ground node 122 (or ground rail, at voltage Vss) of the cell. If node 114 rises too high, the stored cell content may be "flipped", resulting in an incorrect read operation.

The lower the ON-resistance of NFET 120 relative to that of access NFET 118 (commonly referred to as the cell ratio), the smaller the noise figure on the "0" node (114). A lower noise figure, other things being equal, leads to an increase in read stability. In practice, SRAM cells should be designed to meet a specified minimum cell stability. Process scaling may make it harder to achieve this because of an expected increase in device parameter variations, e.g., variations in device threshold voltage.

Various techniques have been proposed to improve cell stability in a SRAM cell. For example, the width of the pull-down nFETs may be increased, but this results in a larger cell area and may make it more difficult to perform a stable write operation. As another example, the length of the (minimum-sized) access transistor in a SRAM cell may be increased, but this leads to a reduction in channel current during a read operation, thereby decreasing speed. As another example, the strength of the pull-down nFETs in a SRAM cell may be increased by driving their source terminals to a negative voltage just before the cell's corresponding wordline is brought HIGH. This boosts the drive of the pull-down nFETs due to increasing both the gate-to-source and drain-to-source voltages. But this requires a negative supply voltage generator with its associated area and power overhead, as well as process technology for a higher gate-oxide breakdown voltage.

DESCRIPTION OF EMBODIMENTS

Figure 1B:
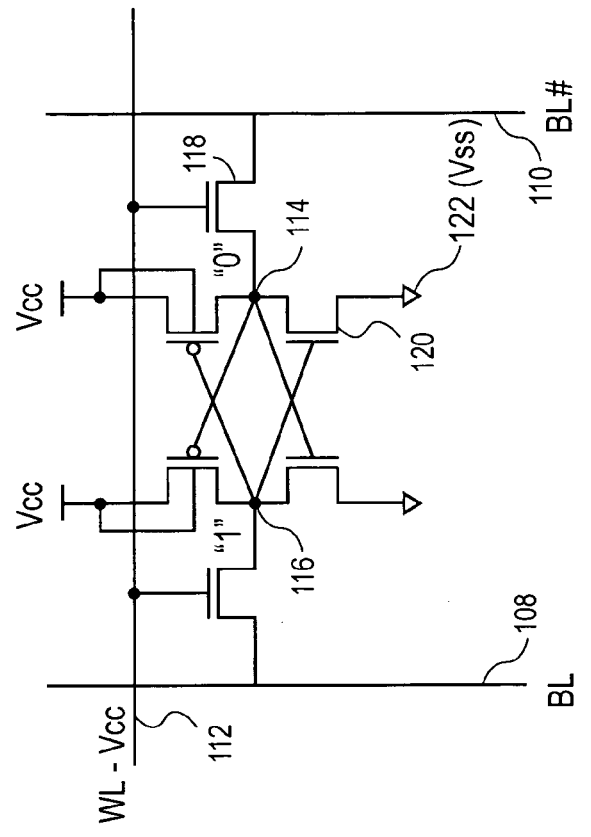
FIG. 1b is a prior art SRAM memory cell at the circuit level.
Figure 2:
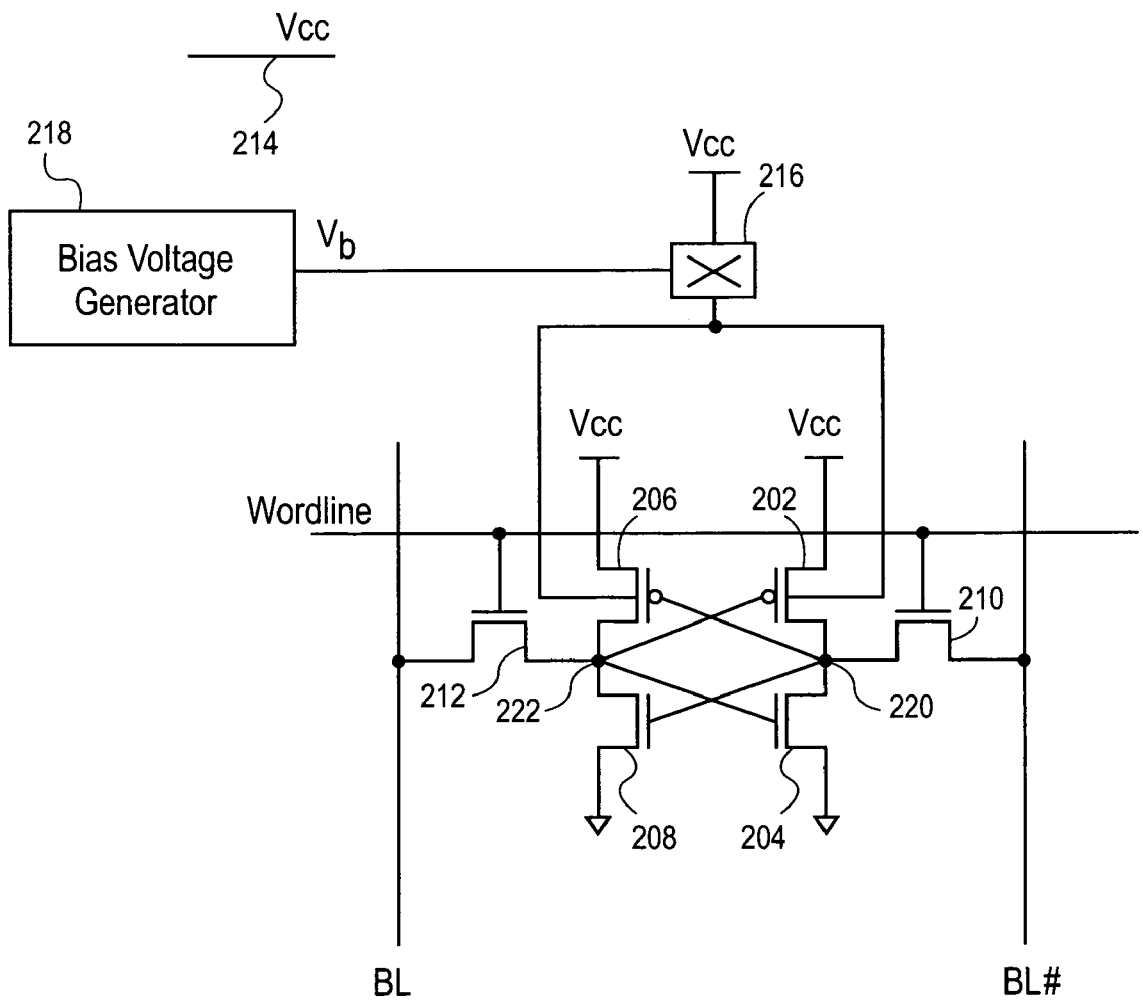
FIG. 2. abstracts a SRAM memory according to an embodiment of the present invention.

An embodiment SRAM cell according to the present invention is shown in FIG. 2. For simplicity, only one 6T SRAM cell is shown having cross-coupled inverters and access transistors, where one of the inverters comprises pull-up pFET 202 and pull-down nFET 204, the other inverter comprises pull-up pFET 206 and pull-down NFET 208, and the access transistors comprise nFETs 210 and 212. The bodies of pull-ups 202 and 206, instead of being directly connected to power rail 214 at voltage Vcc as in FIG. 1b, are connected to switch 216. Switch 216 couples the bodies of pull-ups 202 and 206 either to power rail 214 or to bias voltage generator circuit 218. Bias voltage generator 218 provides a bias voltage Vb less than the rail voltage Vcc. When switch 216 is set to couple the bodies of pull-ups 202 and 206 to bias voltage generator 218, pull-ups 202 and 206 are forward body biased.

Figure 3:
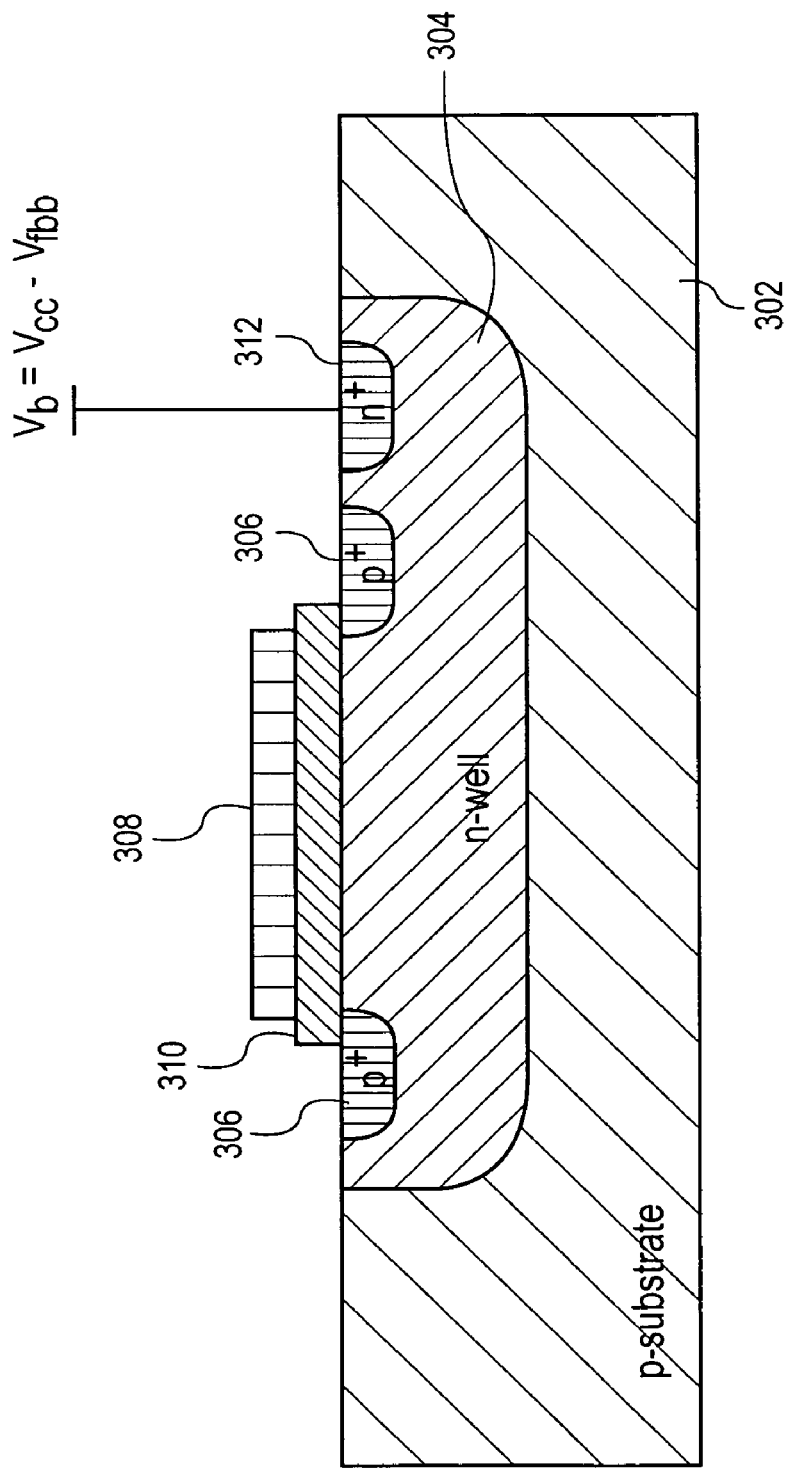
FIG. 3 abstracts a body biased pFET with n-well technology.

Shown in FIG. 3 is a simplified, cross-sectional view of a pFET using a n-well CMOS process. Substrate 302 is a p-substrate in which n-well 304 (the "body") has been formed. Formed within n-well 304 is source/drain terminals 306. Gate 308 is insulated from n-well 304 by insulator 310. FIG. 3 is simplified in that not all layers are shown. (For example, for simplicity, passivation layers are not shown, nor are contacts to source/drain terminals shown.) Any suitable process technology may be utilized to form the transistor of FIG. 3. A body terminal, n+region 312, is formed within n-well 304 so that the body may be biased. For simplicity, the body is shown to be biased at Vb. We may write Vb as Vb=Vcc−Vfbb, where Vfbb is a forward body bias voltage. Preferably, Vfbb should be chosen so as to prevent turning ON the parasitic junction diode formed by the source/drain terminals and the n-well. For example, in some embodiments, Vfbb may be in the range of 400 mV to 500 mV.

Figure 4:
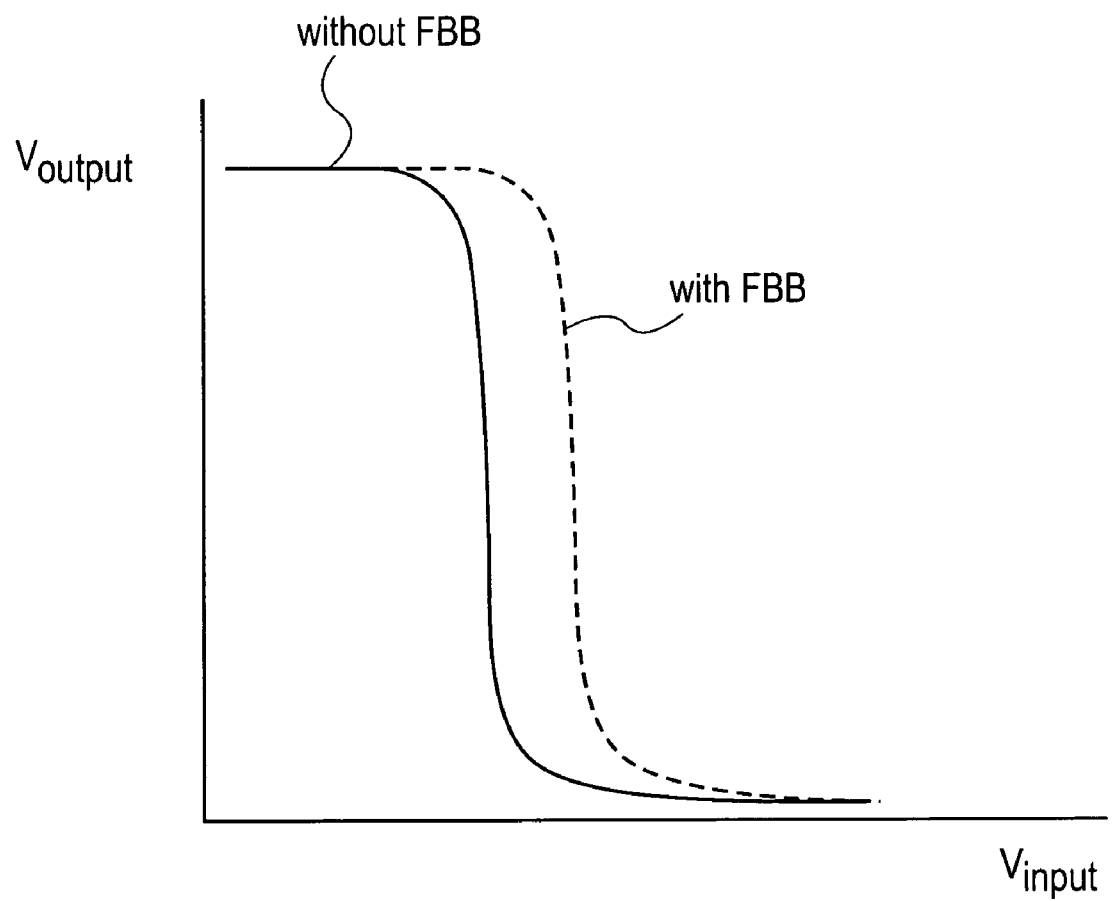
FIG. 4 illustrates the shift in the input-output voltage transfer function of an inverter due to forward body biasing.

Forward body biasing pull-ups 202 and 206 reduces their effective threshold voltage because it makes their source-to-body voltage positive. By forward body biasing pull-ups 202 and 206 during a read operation, the SRAM cell of FIG. 2 has improved read stability. To see this, assume that node 220 is LOW (stores a "0") and node 222 is HIGH (stores a "1"). With pull-up pFET 206 forward body biased, the trip point of the inverter comprising pFET 206 and nFET 208 is shifted. This shifting is illustrated in FIG. 4, where the input-output voltage transfer function of an inverter is shown being shifted to the right when forward body biasing is applied to the pFET of the inverter. As discussed with respect to FIG. 1b, during a read operation the node of 220 rises above LOW. However, with the input-output voltage transfer function of the inverter comprising pFET 206 and NFET 208 shifted to the right, node 220 needs to rise to a higher voltage to flip the cell than when pFET 206 is not forward body biased. That is, a larger noise magnitude is needed to flip the cell during a read operation. As a result, cell read stability is improved.

In other embodiments, switch 216 may not be present and the bodies of pull-ups 202 and 206 may be hardwired to bias voltage generator 218. However, forward body biasing pull-ups 202 and 206 increases both the sub-threshold leakage current and the reverse-bias junction leakage current in these devices. Sub-threshold leakage current may be reduced by increasing the channel length of the devices in the SRAM cells. Nevertheless, in present microprocessors, embedded SRAM often makes up a sizeable portion of the total core area, so that any increase in SRAM power dissipation may be costly. Accordingly, by using switch 216, dynamic forward body biasing may be employed to reduce power dissipation.

Figure 5:
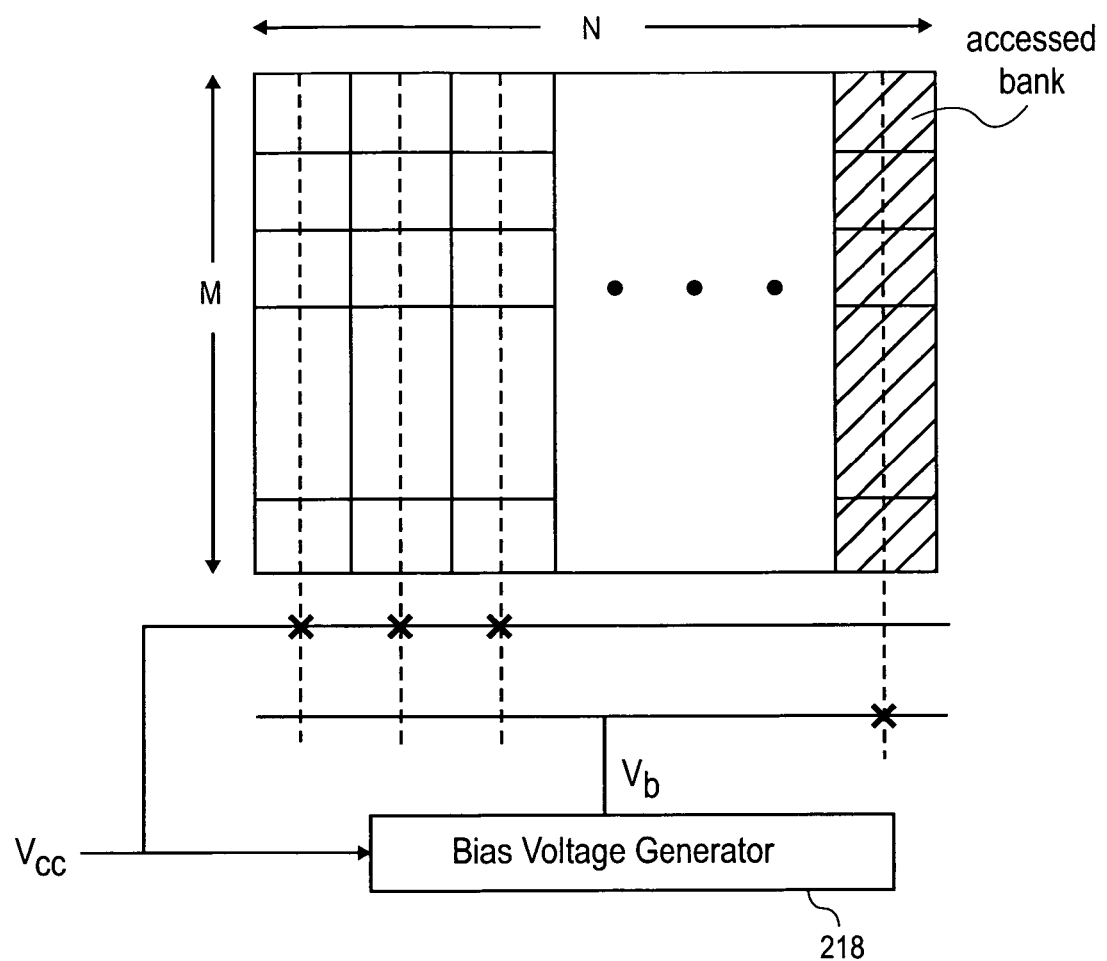
FIG. 5 abstracts a SRAM memory according to another embodiment of the present invention.

For example, FIG. 5 depicts, in simplified form, a large SRAM array with N·M banks, where N>>M. Upon a read or write, only M banks are accessed at a time. For example, the banks cross-hatched in FIG. 4 may be accessed during a read operation. For those M banks being accessed, their n-wells are coupled to bias voltage generator 218 so that the pull-ups in the cells of these M banks are forward body biased. All of the other banks not being accessed have their n-wells at Vcc, so that their respective pull-ups are not forward body biased. Because the bank address is known ahead of a wordline address, selected banks may be dynamically forward body biased while the wordline address is being decoded. Under this scenario, dynamic forward body biasing does not increase pipeline latency.

Switch 216 may be any device or combination of devices, for example, it may comprise a pass transistor or a transmission gate. Many types of circuits may be employed to realize bias voltage generator 218. For example, a band-gap reference generator circuit may be used that tracks variation in Vcc, temperature, and process.

It may be noted that while forward body biasing improves read stability of a SRAM cell, it makes it harder to write. This is because a write operation begins with discharging the HIGH node of the SRAM, which is "stronger" due to the forward body biasing. As a result, it is expected that write stability may be degraded. However, in practice, read stability is often one of the main limitations in SRAM cell design, and there is usually ample margin in write stability. If, however, write stability is an issue, then a dynamic forward body biasing scenario may be employed in which forward body biasing is applied to all columns in a SRAM array except those being written to, where the ones undergoing a write operation are not forward body biased. In this case, both bank and column address should be known in advance so as not to affect latency. Furthermore, n-wells should not be shared in adjacent cells located in the same memory row.

Figure 1A:
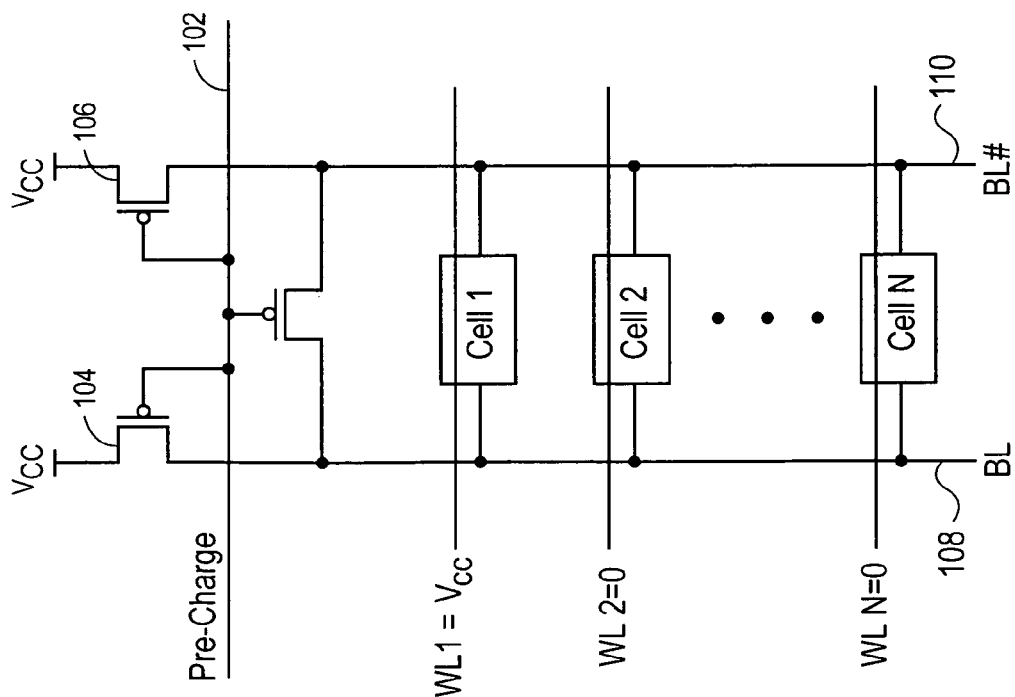
FIG. 1a abstracts a prior art SRAM memory array.
Figure 6:
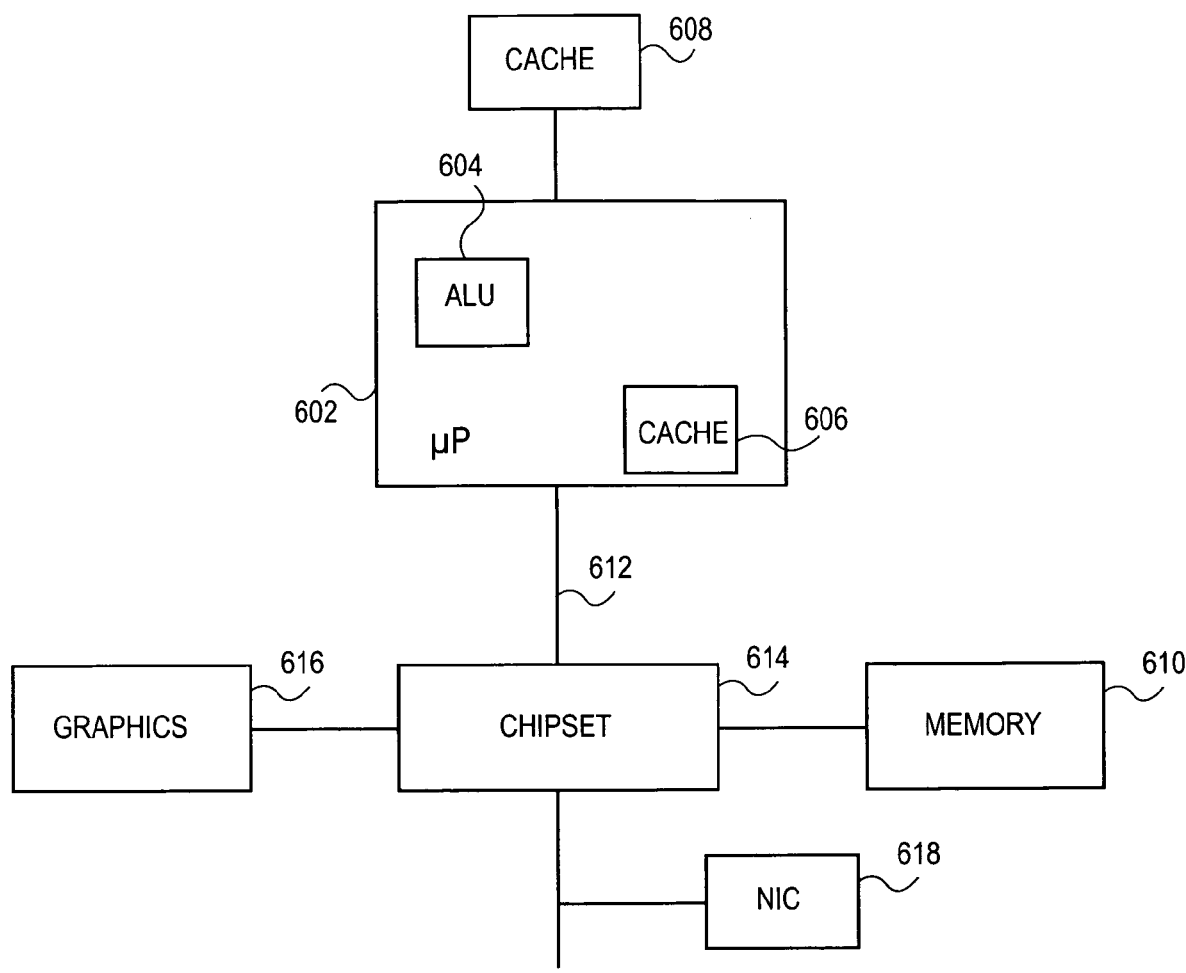

Embodiments of the present invention may be of use in many electronic systems employing SRAM, such as the computer system illustrated in FIG. 6. In FIG. 1, die 602 comprises a microprocessor with many sub-blocks, such as arithmetic logic unit (ALU) 604 and on-die cache 606. Die 602 may also communicate to other levels of cache, such as off-die cache 608. Higher memory hierarchy levels, such as system memory 610, are accessed via host bus 612 and chipset 614. In addition, other functional units not on die 602, such as graphics accelerator 616 and network interface controller (NIC) 618, to name just a few, may communicate with die 602 via appropriate busses or ports. Each of these functional units may physical reside on one die or more than one die. Some or parts of more than one functional unit may reside on the same die. SRAM may used in many of these functional units. In particular, SRAM is usually used in the caches.

It is to be understood in these letters patent that the meaning of "A is connected to B" is that A and B are connected by a passive structure for making a direct electrical connection so that the voltage potential of A and B are substantially equal to each other. For example, A and B may be connected by way of an interconnect, transmission line, etc. In integrated circuit technology, the "interconnect" may be exceedingly short, comparable to the device dimension itself. For example, the gates of two transistors may be connected to each other by polysilicon or copper interconnect that is comparable to the gate length of the transistors.

It is also to be understood that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements. For example, A may be connected to a circuit element which in turn is connected to B.

What is claimed is:

1. A memory cell comprising:
   a first inverter comprising a first pull-up transistor, the first pull-up transistor comprising a first body terminal;
   a second inverter cross-coupled to the first inverter and comprising a second pull-up transistor comprising a second body terminal; and
   a switch connected to the first and second body terminals, the switch coupling the first and the second body terminals to a forward body bias voltage.

2. The memory cell as set forth in claim 1, the memory cell further comprising a power rail and a ground rail, wherein
   the first pull-up transistor of the first inverter is a first pFET, further comprising a first source terminal connected to the power rail, a first gate terminal, and a first drain terminal;
   the first inverter further comprises a first pull-down nFET comprising a second drain terminal connected to the first drain terminal of the first pFET of the first inverter, comprising a second gate terminal, and comprising a second source terminal connected to the ground rail;
   the second pull-up transistor of the second inverter is a second pFET, further comprising a third source terminal connected to the power rail, a third gate terminal, and a third drain terminal;
   the second inverter further comprises a second pull-down NFET comprising a fourth drain terminal connected to the third drain terminal of the second pFET of the second inverter, comprising a fourth gate terminal, and comprising a fourth source terminal connected to the ground rail; and
   wherein the first and second gates of the first pFET and the first NFET, respectively of the first inverter are connected to the third drain of the second pFET of the second inverter, and the third and fourth gates of the second pFET and the second nFET, respectively, of the second inverter are connected to the first drain of the first pFET of the first inverter.

3. A memory cell comprising:
a first inverter comprising a first pull-up transistor, the first pull-up transistor comprising a first body; and
a second inverter cross-coupled to the first inverter and comprising a second pull-up transistor comprising a second body;
wherein the first and second bodies are forward biased.

4. The memory cell as set forth in claim 3, the memory cell further comprising a power rail and a ground rail, wherein
the first pull-up transistor of the first inverter is a first pFET, further comprising a first source terminal connected to the power rail, a first gate terminal, and a first drain terminal;
the first inverter further comprises a first pull-down nFET comprising a second drain terminal connected to the first drain terminal of the first pFET of the first inverter, comprising a second gate terminal, and comprising a second source terminal connected to the ground rail;
the second pull-up transistor of the second inverter is a second pFET, further comprising a third source terminal connected to the power rail, a third gate terminal, and a third drain terminal;
the second inverter further comprises a second pull-down NFET comprising a fourth drain terminal connected to the third drain terminal of the second pFET of the second inverter, comprising a fourth gate terminal, and comprising a fourth source terminal connected to the ground rail; and
wherein the first and second gates of the first pFET and the first NFET, respectively, of the first inverter are connected to the third drain of the second pFET of the second inverter, and the third and fourth gates of the second pFET and the second nFET, respectively, of the second inverter are connected to the first drain of the first pFET of the first inverter.

5. A memory comprising:
a cell comprising:
a first inverter comprising a first pull-up transistor comprising a first body terminal and a first source terminal; and
a second inverter comprising a second pull-up transistor comprising a second body terminal and a second source terminal, wherein the first and second inverters are cross-coupled to each other;
wherein the first and second source terminal are coupled to a power rail, the power rail having a voltage Vcc; and
wherein the first and second body terminals are coupled to a bias voltage generator, the bias voltage generator having a voltage Vb, wherein Vb<Vcc.

6. The memory as set forth in claim 5, further comprising:
a switch coupling the voltage Vb of the bias voltage generator to the first and second body terminals during a read operation on the memory cell.

7. The memory as set forth in claim 6, the memory comprising a ground rail, the ground rail having a voltage Vss, where Vss<Vb, wherein
the first pull-up transistor of the first inverter is a first pFET, further comprising a first gate terminal and a first drain terminal;
the first inverter further comprises a first pull-down NFET comprising a second drain terminal connected to the first drain terminal of the first pFET of the first inverter, the first pull-down nFET comprising a second gate terminal, and comprising a second source terminal connected to the ground rail;
the second pull-up transistor of the second inverter is a second pFET, further comprising a third gate terminal and a third drain terminal;
the second inverter further comprises a second pull-down NFET comprising a fourth drain terminal connected to the third drain terminal of the second pFET of the second inverter, comprising a fourth gate terminal, and comprising a fourth source terminal connected to the ground rail; and
wherein the first and second gates of the first pFET and the first nFET, respectively, of the first inverter are connected to the third drain of the second pFET of the second inverter, and the third and fourth gates of the second pFET and the second NFET, respectively, of the second inverter are connected to the first drain of the first pFET of the first inverter.

8. The memory as set forth in claim 5, the memory comprising a ground rail, the ground rail having a voltage Vss, where Vss<Vb, wherein
the first pull-up transistor of the first inverter is a first pFET, further comprising a first gate terminal and a first drain terminal;
the first inverter further comprises a first pull-down nFET comprising a second drain terminal connected to the first drain terminal of the first pFET of the first inverter, the first pull-down nFET comprising a second gate terminal, and comprising a second source terminal connected to the ground rail;
the second pull-up transistor of the second inverter is a second pFET, further comprising a third gate terminal and a third drain terminal;
the second inverter further comprises a second pull-down nFET comprising a fourth drain terminal connected to the third drain terminal of the second pFET of the second inverter, comprising a fourth gate terminal, and comprising a fourth source terminal connected to the ground rail; and
wherein the first and second gates of the first pFET and the first nFET, respectively, of the first inverter are connected to the third drain of the second pFET of the second inverter, and the third and fourth gates of the second pFET and the second nFET, respectively, of the second inverter are connected to the first drain of the first pFET of the first inverter.

9. A system comprising:
a first die comprising a functional unit;
a second die comprising a processor, the second die distinct from the first die, the second die comprising:
a memory cell, the cell comprising:
a first inverter comprising a first pull-up transistor comprising a first body terminal and a first source terminal; and
a second inverter comprising a second pull-up transistor comprising a second body terminal and a second source terminal, wherein the first and second inverters are cross-coupled to each other;
a power rail coupled to the first and second source terminals, the power rail having a voltage Vcc; and
a bias voltage generator coupled to the first and second body terminals, the bias voltage generator having a voltage Vb, wherein Vb<Vcc.

10. The system as set forth in claim 9, the second die further comprising:
a switch coupling the voltage Vb of the bias voltage generator to the first and second body terminals during a read operation on the memory cell.

11. The system as set forth in claim 10, the second die further comprising a ground rail having a voltage Vss, where Vss<Vb, wherein the first pull-up transistor of the first inverter is a first pFET, further comprising a first gate terminal and a first drain terminal;

the first inverter further comprises a first pull-down NFET comprising a second drain terminal connected to the first drain terminal of the first pFET of the first inverter, comprising a second gate terminal, and comprising a second source terminal connected to the ground rail;

the second pull-up transistor of the second inverter is a second pFET, further comprising a third gate terminal and a third drain terminal;

the second inverter further comprises a second pull-down nFET comprising a fourth drain terminal connected to the third drain terminal of the second pFET of the second inverter, the second pull-down nFET comprising a fourth gate terminal, and comprising a fourth source terminal connected to the ground rail; and wherein the first and second gates of the first pFET and the first nFET, respectively of the first inverter are connected to the third drain of the second pFET of the second inverter, and the third and fourth gates of the second pFET and the second nFET, respectively of the second inverter are connected to the first drain of the first pFET of the first inverter.

12. The system as set forth in claim 9, the second die further comprising a ground rail to provide a voltage Vss, where Vss<Vb, wherein the first pull-up transistor of the first inverter is a first pFET, further comprising a first gate terminal and a first drain terminal;

the first inverter further comprises a first pull-down NFET comprising a second drain terminal connected to the first drain terminal of the first pFET of the first inverter, the first pull-down NFET comprising a second gate terminal, and comprising a second source terminal connected to the ground rail;

the second pull-up transistor of the second inverter is a second pFET, further comprising a third gate terminal and a third drain terminal;

the second inverter further comprises a second pull-down NFET comprising a fourth drain terminal connected to the third drain terminal of the second pFET of the second inverter, comprising a fourth gate terminal, and comprising a fourth source terminal connected to the ground rail; and wherein the first and second gates of the first pFET and the first nFET, respectively, of the first inverter are connected to the third drain of the second pFET of the second inverter, and the third and fourth gates of the second pFET and the second nFET, respectively, of the second inverter are connected to the first drain of the first pFET of the first inverter.

* * * * *